United States Patent
Kawate

(10) Patent No.: US 10,312,609 B2
(45) Date of Patent: Jun. 4, 2019

(54) LOW PROFILE ELECTRICAL CONNECTOR

(71) Applicant: 3M INNOVATIVE PROPERTIES COMPANY, St. Paul, MN (US)

(72) Inventor: Yoshihisa Kawate, Tokyo (JP)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 15/573,845

(22) PCT Filed: Apr. 27, 2016

(86) PCT No.: PCT/US2016/029491
§ 371 (c)(1),
(2) Date: Nov. 14, 2017

(87) PCT Pub. No.: WO2016/195849
PCT Pub. Date: Dec. 8, 2016

(65) Prior Publication Data
US 2018/0261936 A1    Sep. 13, 2018

Related U.S. Application Data

(60) Provisional application No. 62/170,404, filed on Jun. 3, 2015.

(51) Int. Cl.
*H01R 12/62* (2011.01)
*H01R 12/58* (2011.01)
(Continued)

(52) U.S. Cl.
CPC ......... *H01R 12/585* (2013.01); *H01B 11/203* (2013.01); *H01R 12/596* (2013.01); *H01R 12/62* (2013.01); *H05K 2201/1059* (2013.01)

(58) Field of Classification Search
CPC .... H01R 12/585; H01R 12/596; H01R 12/62; H01B 11/203; H05K 2201/1059
See application file for complete search history.

(56) References Cited

U.S. PATENT DOCUMENTS 4,295,704 A * 10/1981 Narozny .............. H01R 4/2458
439/406
4,341,430 A    7/1982 Crawford
(Continued)

FOREIGN PATENT DOCUMENTS

EP    0 149 907    7/1985
JP    2009-026629    2/2009
(Continued)

OTHER PUBLICATIONS

PCT International Search Report from PCT/US2016/029491 dated Aug. 9, 2016, 3 pages.

*Primary Examiner* — Truc T Nguyen
(74) *Attorney, Agent, or Firm* — Robert S. Moshrefzadeh

(57) ABSTRACT

A connector and a connector assembly for electrically connecting an electrical cable to a circuit board is described. The connector includes an insulative housing and a plurality of self-supporting terminals. Each of the self-supporting terminal has a retaining portion retained in a corresponding receiving through hole disposed through the housing, a contact portion extending from an upper end of, and perpendicular to the retaining portion such that the contact portion is disposed on an upper surface of the housing and a press-fit portion extending from a lower end of, and substantially parallel to the retaining portion, wherein the press-fit portion extends down from the lower surface of the housing. The connector electrically and physically connecting a conductive wire of an electrical cable with a conductive via of a circuit board by inserting each press-fit portion of the self-supporting terminals into said conductive via.

25 Claims, 11 Drawing Sheets

(51) Int. Cl.
*H01B 11/20* (2006.01)
*H01R 12/59* (2011.01)

(56) References Cited

U.S. PATENT DOCUMENTS

| | | | | |
|---|---|---|---|---|
| 4,477,137 A * | 10/1984 | Ayer | ............... | H01R 13/193 |
| | | | | 439/495 |
| 4,955,819 A | 9/1990 | Harting et al. | | |
| 6,109,976 A | 8/2000 | van Zanten et al. | | |
| 7,722,405 B2 * | 5/2010 | Jaklin | ............... | H05K 5/0247 |
| | | | | 439/638 |
| 7,833,061 B2 * | 11/2010 | Hori | ............... | H01R 13/7195 |
| | | | | 439/620.21 |
| 8,658,899 B2 | 2/2014 | Gundel | | |
| 8,946,558 B2 | 2/2015 | Gundel | | |
| 9,847,598 B2 * | 12/2017 | Lim | ............... | H01R 9/032 |
| 2003/0036304 A1 | 2/2003 | Soubh | | |
| 2004/0161975 A1 * | 8/2004 | Sakai | ............... | H01R 12/58 |
| | | | | 439/620.21 |
| 2006/0194475 A1 * | 8/2006 | Miyazaki | ............... | H01R 9/0527 |
| | | | | 439/578 |
| 2010/0279523 A1 | 11/2010 | Schwettmann et al. | | |
| 2012/0090866 A1 | 4/2012 | Gundel | | |
| 2012/0090873 A1 | 4/2012 | Gundel | | |
| 2012/0190242 A1 * | 7/2012 | Kataoka | ............... | H01R 12/585 |
| | | | | 439/626 |
| 2012/0258612 A1 * | 10/2012 | Nichols | ............... | H01R 12/73 |
| | | | | 439/63 |
| 2012/0264337 A1 | 10/2012 | Gross | | |
| 2012/0298395 A1 | 11/2012 | Gundel | | |
| 2014/0342619 A1 * | 11/2014 | Uchida | ............... | H01R 12/585 |
| | | | | 439/751 |
| 2014/0345902 A1 | 11/2014 | Gundel | | |
| 2015/0053454 A1 | 2/2015 | Gundel | | |
| 2015/0222029 A1 * | 8/2015 | Neu | ............... | H01R 13/6335 |
| | | | | 439/159 |
| 2015/0364847 A1 * | 12/2015 | Yao | ............... | H01R 12/57 |
| | | | | 439/869 |
| 2017/0214161 A1 * | 7/2017 | Yamada | ............... | H01R 12/716 |

FOREIGN PATENT DOCUMENTS

| | | |
|---|---|---|
| JP | 2011-003291 | 1/2011 |
| WO | WO 2009/114225 | 9/2009 |

* cited by examiner

LOW PROFILE ELECTRICAL CONNECTOR

BACKGROUND OF THE INVENTION

Field of the Invention

The present invention relates to a low profile a connector for electrically connecting an electrical cable to a circuit board. Specifically, the height of the connector above the surface of the circuit board can be minimized through the use of L-shaped terminals that allow the cable to enter the connector parallel to the circuit board.

Background

In conventional electronics, equipment will frequently include printed circuit boards (PCBs) with integrated circuits attached thereto. The integrated circuits are typically interconnected with the PCB's input/output ports by conductive traces formed in or on the PCB. These conductive traces can be lossy and can vary in length. For example, the input/output ports of a motherboard are frequently disposed near the edge of the PCB and comprise an input/output connector, such as a QSFP connector system. As circuit boards have become more complex, the number of input/output ports has increased. To accommodate the larger number of input/output ports, input/output connector systems are stacked in order to take advantage of the unused space above board to increase input/output density. The connector at the top of a stack will require longer leads than the connectors beneath it to connect to the conductive traces of the PCB. Increasing the length of the connector leads can limit bandwidth due to imprecise impedance matching and crosstalk issues. The industry demands of finer pitch input/output connectors and faster circuit switching speeds is pushing the limits of design and manufacturing of these input/output connector systems.

Thus, there is a need for connector designs that increased signal line densities with closely controlled electrical characteristics to achieve satisfactory control of the signal integrity.

SUMMARY

The present invention is a connector for electrically connecting an electrical cable to a circuit board that solves or alleviates one or more of the problems of the prior art.

In a first embodiment, the connector includes an insulative housing defining a plurality of receiving through holes therein extending between opposing uppermost and lowermost major surfaces of the housing; and a plurality of self-supporting terminals. Each of the self-supporting terminal has a retaining portion that is received in a corresponding receiving through hole to retain the terminal in the insulative housing, a contact portion extending from an upper end of, and in a direction substantially perpendicular to, the retaining portion such that the contact portion is disposed on the uppermost major surface of the insulative housing, and a press-fit portion extending from a lower end of, and in a direction substantially parallel to, the retaining portion, the press-fit portion extending downwardly from the lowermost major surface of the insulative housing. Thus, the exemplary connector is adapted to electrically and physically engage a conductive wire of an electrical cable and connect the conductive wire with a conductive via of a circuit board by insertion of each of the press-fit portion of the self-supporting terminals into a conductive via formed in the circuit board.

In a second embodiment, a connector assembly comprises a connector electrically connecting a plurality of conductive wires to a circuit board comprising a plurality of conductive vias. The connector includes a housing defining a plurality of receiving through holes therein extending between opposing uppermost and lowermost major surfaces of the housing; and a plurality of self-supporting terminals. Each of the self-supporting terminal has a retaining portion that is received in a corresponding receiving through hole to retain the terminal in the housing, a contact portion extending from an upper end of, and in a direction substantially perpendicular to, the retaining portion such that the contact portion is disposed on the uppermost major surface of the housing, and a press-fit portion extending from a lower end of, and in a direction substantially parallel to, the retaining portion, the press-fit portion extending downwardly from the lowermost major surface of the housing. Thus, the exemplary connector is adapted to electrically and physically engage a conductive wire of an electrical cable and connect the conductive wire with a conductive via of a circuit board by insertion of each of the press-fit portion of the self-supporting terminals into a conductive via formed in the circuit board.

The exemplary cable assembly described herein can be low profile since the cable is oriented parallel to the circuit board when the connector is connected to the board. Thus, the height of the connector above the surface of the circuit board can be minimized.

In a third embodiment, the connector includes an insulative housing defining a plurality of receiving through holes therein and a plurality of self-supporting terminals, each self-supporting terminal has a retaining portion received in a corresponding receiving through hole to retain the terminal in the housing, a contact portion extending from an upper end of the retaining portion, a press-fit portion extending from a lower end of the retaining portion, and a press portion at the upper end of the retaining portion and exposed outside of the housing, such that when mating the connector with a circuit board, the press portion is pressed externally so that the press-fit portion is inserted into a conductive via of the circuit board, wherein the contact portion is disposed within the housing and adapted to electrically and physically engage a conductive wire of an electrical cable. Thus, the exemplary connector is adapted to electrically and physically engage a conductive wire of an electrical cable and connect the conductive wire with a conductive via of a circuit board by insertion of each of the press-fit portion of the self-supporting terminals into conductive via formed in the circuit board.

In a fourth embodiment, a method of electrically connecting a plurality of wires to a plurality of conductive vias in a circuit board is described. The circuit board includes a plurality of conductive vias formed therein. An insulative housing is provided that has a plurality of receiving through holes therein extending between opposing uppermost and lowermost major surfaces of the housing. A self-supporting terminal is inserted into each receiving through hole from the uppermost major surface of the insulative housing, wherein the self-supporting terminal comprises a contact portion disposed on the uppermost major surface of the insulative housing, a retaining portion received in the receiving through hole for retaining the terminal in the insulative housing, and a press-fit portion extending downwardly from the lowermost major surface of the insulative housing. An exposed conductive end of a conductive wire for is electrically and physically connected to the contact portion of each self-supporting terminal, and a cover is assembled onto the uppermost major surface of the insulative housing. The cover has an opening therein such that a portion of each self-supporting terminal is exposed and accessible through the opening. The insulative housing is placed on the circuit board so that the press-fit portion of each self-supporting terminal is aligned with a corresponding conductive via. Each exposed portion of at least one self-supporting terminal is accessed through the opening and pressed until the press-fit portion of the at least one self-supporting terminal is inserted into the corresponding conductive via.

BRIEF DESCRIPTION OF THE DRAWINGS

The present invention will be further described with reference to the accompanying drawings wherein like reference numerals refer to like parts in the several views, and wherein.

Figure 1A:
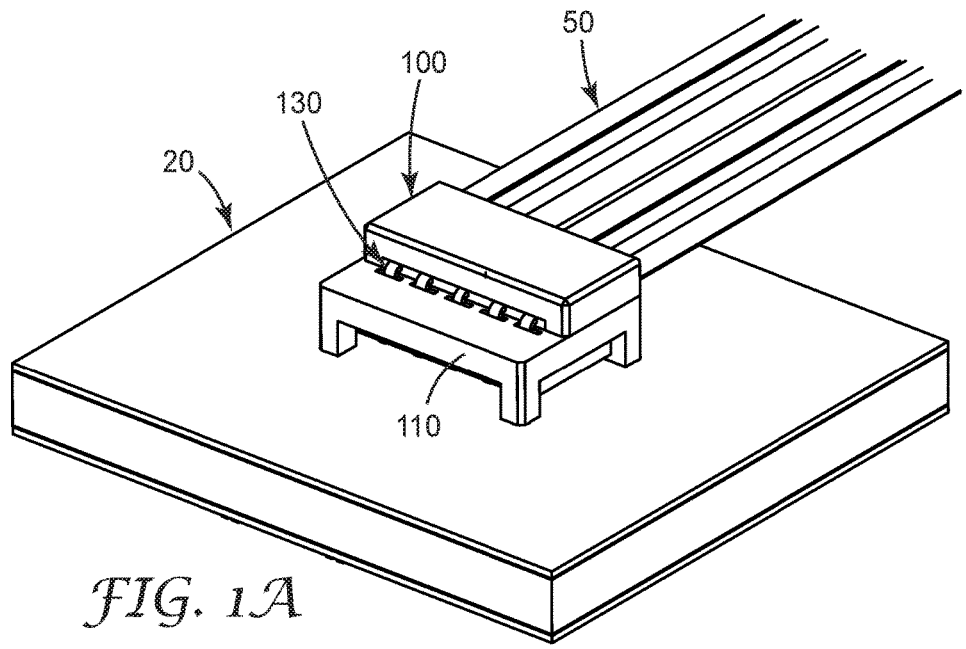
FIGS. 1A-1D are four perspective views of an exemplary low profile electrical connector according to the present invention.

While the invention is amenable to various modifications and alternative forms, specifics thereof have been shown by way of the drawings and will be described herein in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF THE EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention relates to a connector and a connector assembly for electrically connecting an electrical cable to a circuit board. In one aspect, the exemplary connector provides a solderless interconnection to the printed circuit board replacing standard pin style connections which can result in high factory yield loss and eliminate the need for 100% electrically test. In another aspect, the exemplary connector can be used with a low profile, high data rate cable yielding a low profile cable/connector assembly.

FIGS. 1A-1D show an exemplary low profile electrical connector 100 capable of connecting a fine pitch, high data rate cable 50 to a printed circuit board 20. Connector 100 comprises an insulative housing 110 and a plurality of self-supporting terminals 130 disposed at least partially within the housing.

Figure 1B:
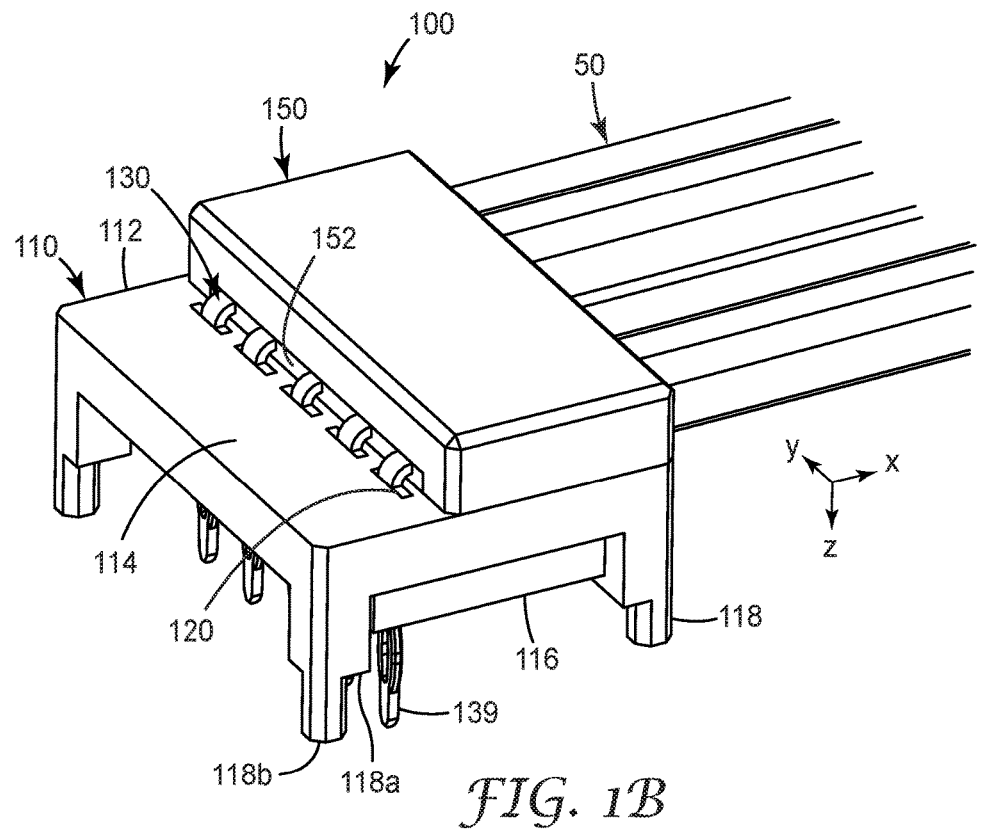
Figure 1C:
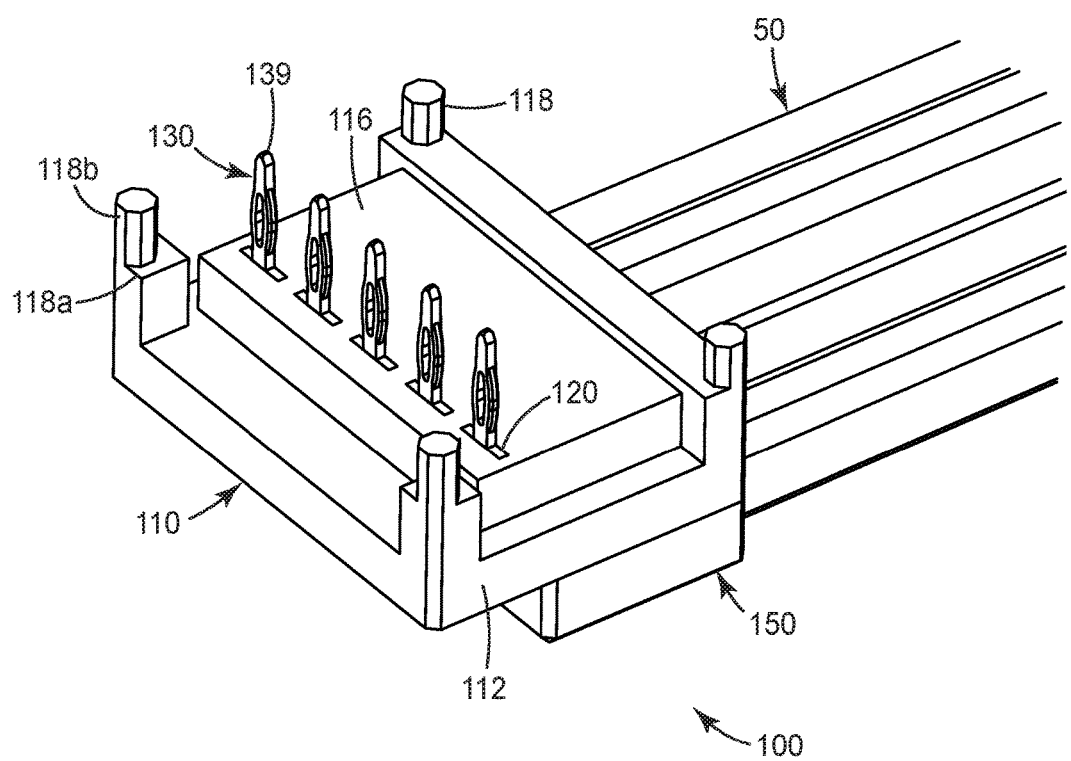
Figure 1D:
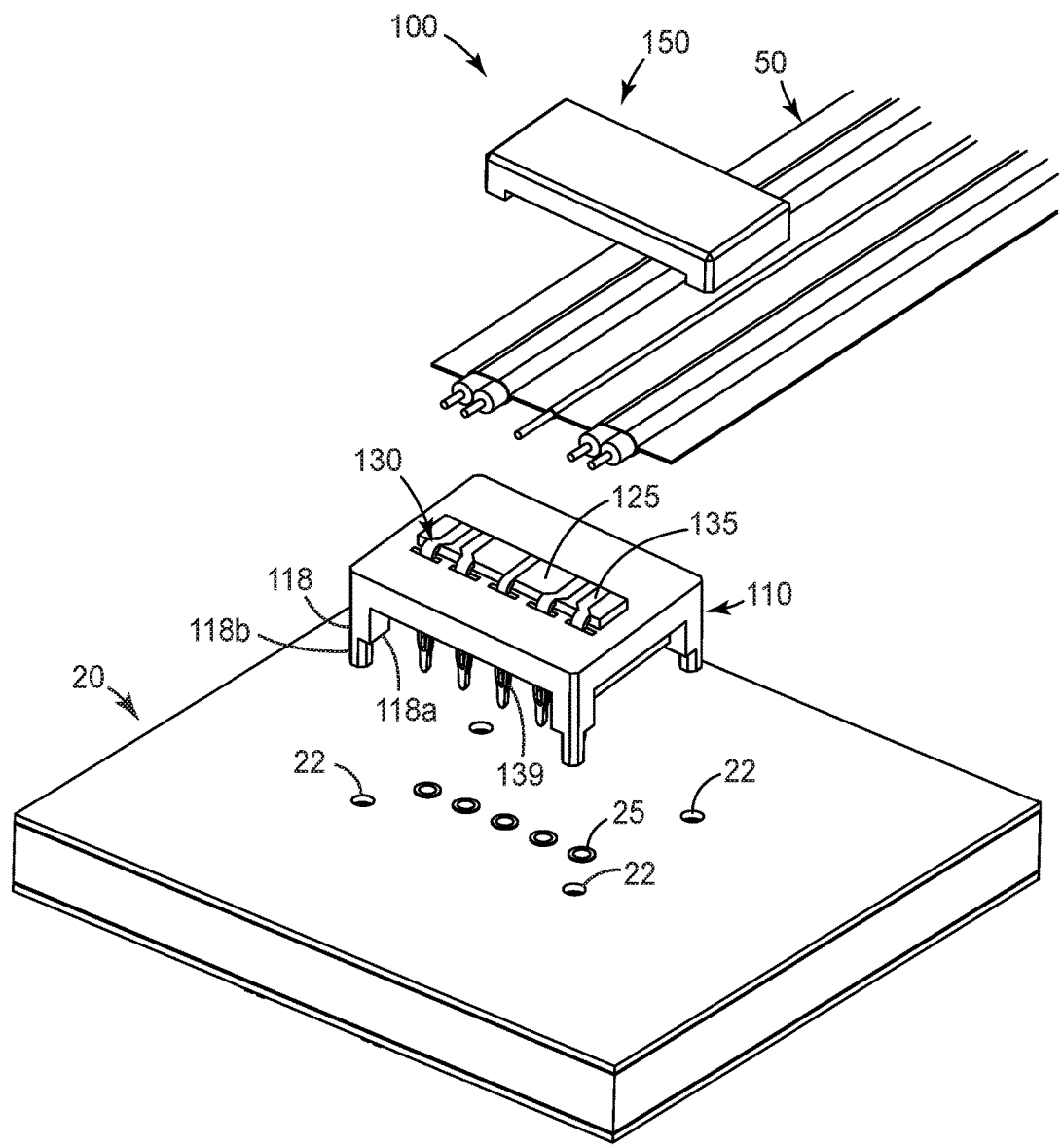

Insulative housing 110 comprises a base 112 portion having a first or uppermost major surface 114 and a second or lowermost major surface 116. Base 112 can have a generally rectangular shape although the shape of the base should not be considered limiting in context of the current disclosure. The base can have a plurality of alignment legs 118 extending from one of its major surfaces, such as lowermost surface 116 as shown in FIGS. 1B-1D to facilitate mounting of the connector to a circuit board. Each leg can include a peg portion 118b at the terminal end of the alignment leg wherein the peg portion can fit into an aperture 22 through the PCB to control the x-y or horizontal positioning of connector 100 and at least one shoulder 118a disposed between the peg portion and the lowermost major surface of the base wherein the shoulder rests against a surface of the PCB to control the z or vertical positioning of connector relative to the PCB.

A plurality of receiving through holes 120 can be formed through the base 112 of insulative housing 110 between opposing uppermost and lowermost major surfaces 114, 116, respectively, to secure the plurality of self-supporting terminals 130 in connector 100. In a first aspect, the plurality of receiving through holes can be arranged in a linear array as shown in FIGS. 1A-1D. In another aspect, the plurality of the receiving through holes are arranged in two or more rows yielding a two dimensional array of receiving through holes.

Figure 4:
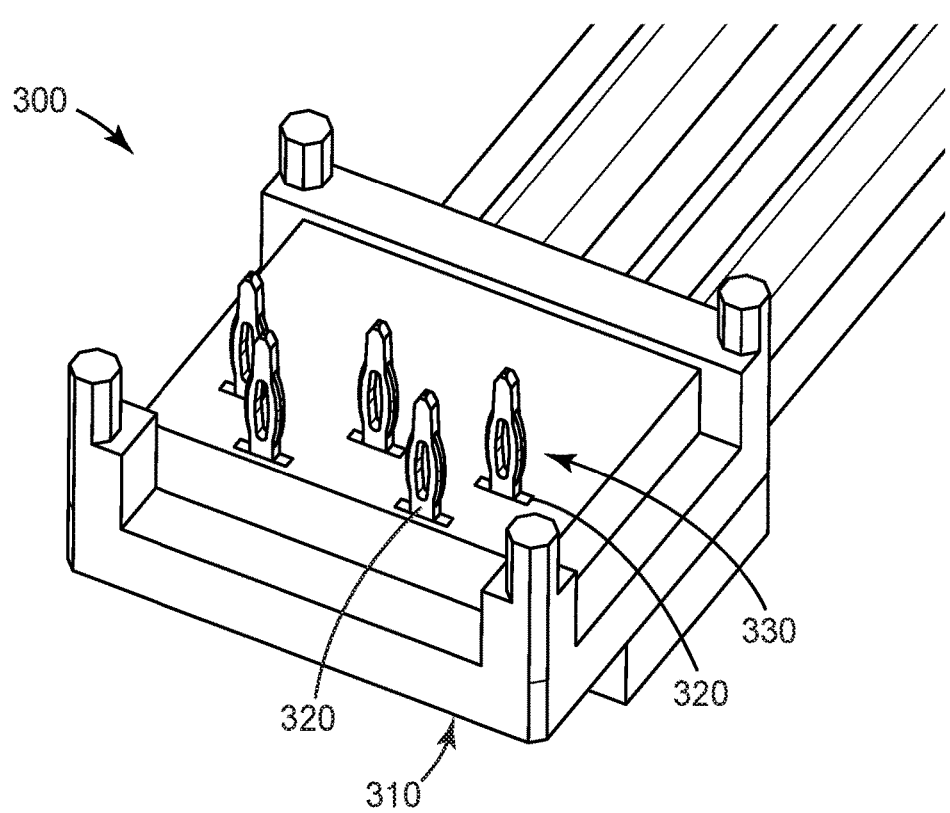
FIG. 4 is an perspective bottom view of another exemplary low profile electrical connector according to the present invention.

Alternatively, FIG. 4 shows a bottom perspective view of another exemplary low profile electrical connector 300 wherein the self-supporting terminals 330 extend through plurality of receiving through holes 320 disposed in two staggered rows formed in insulative housing 310.

Figure 2A:
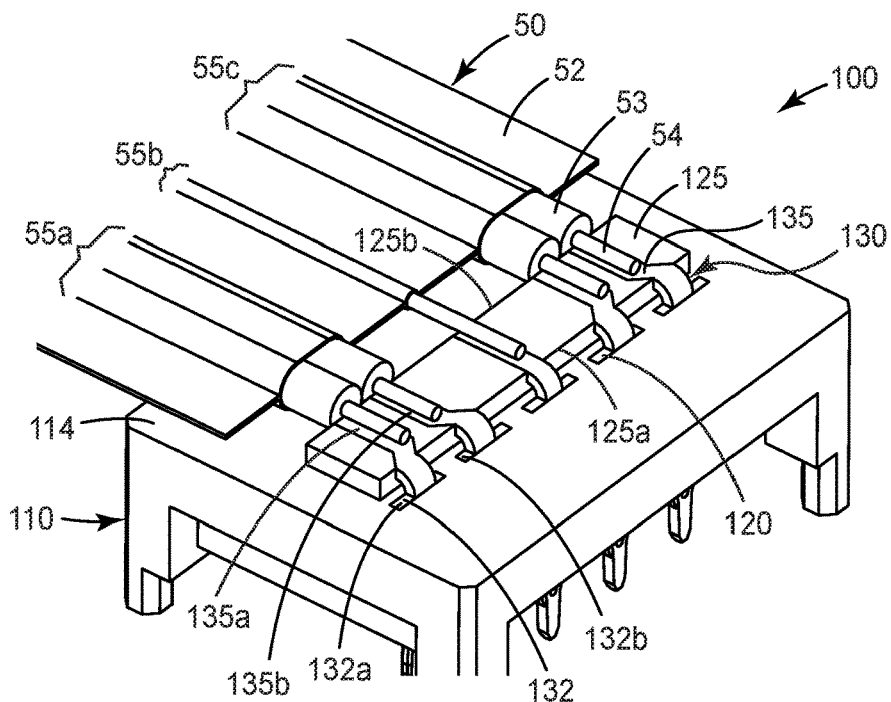
FIGS. 2A-2C are three views of an insulative housing of low profile electrical connector of FIGS. 1A-1D with the cover removed.
Figure 2B:
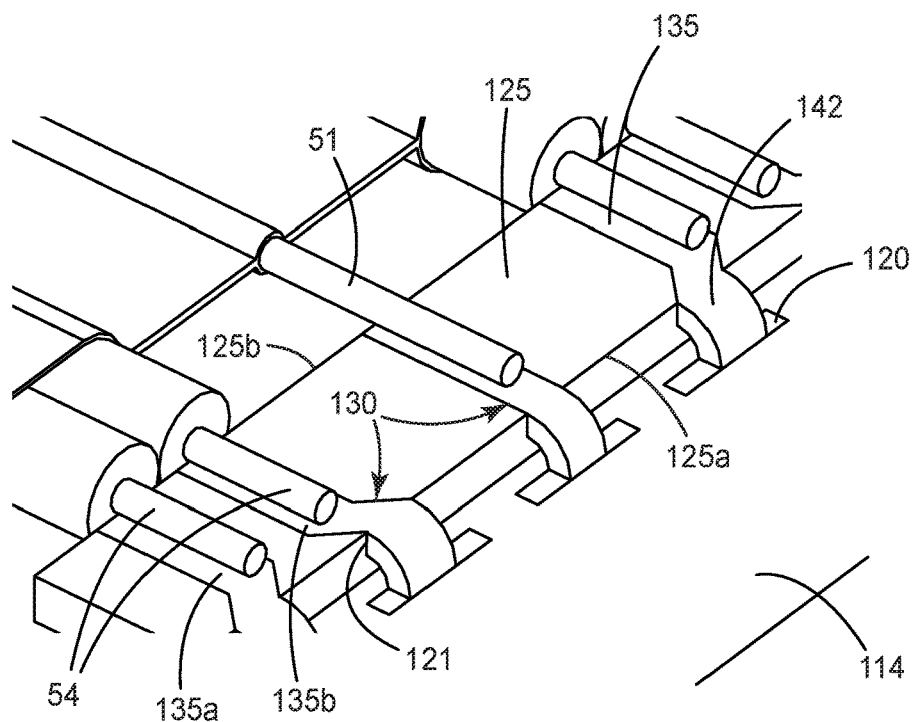
Figure 2C:
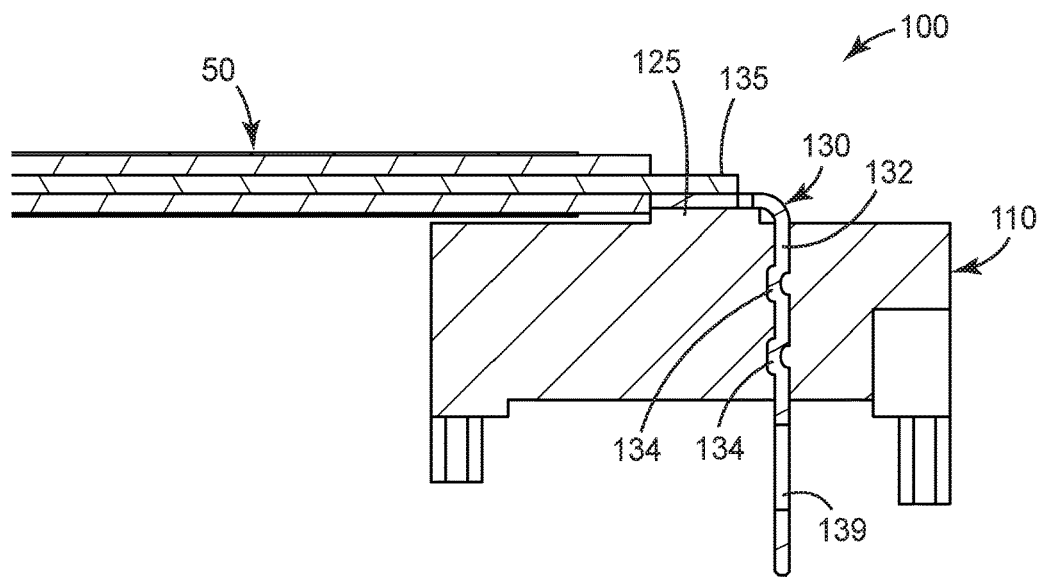
Figure 3A:
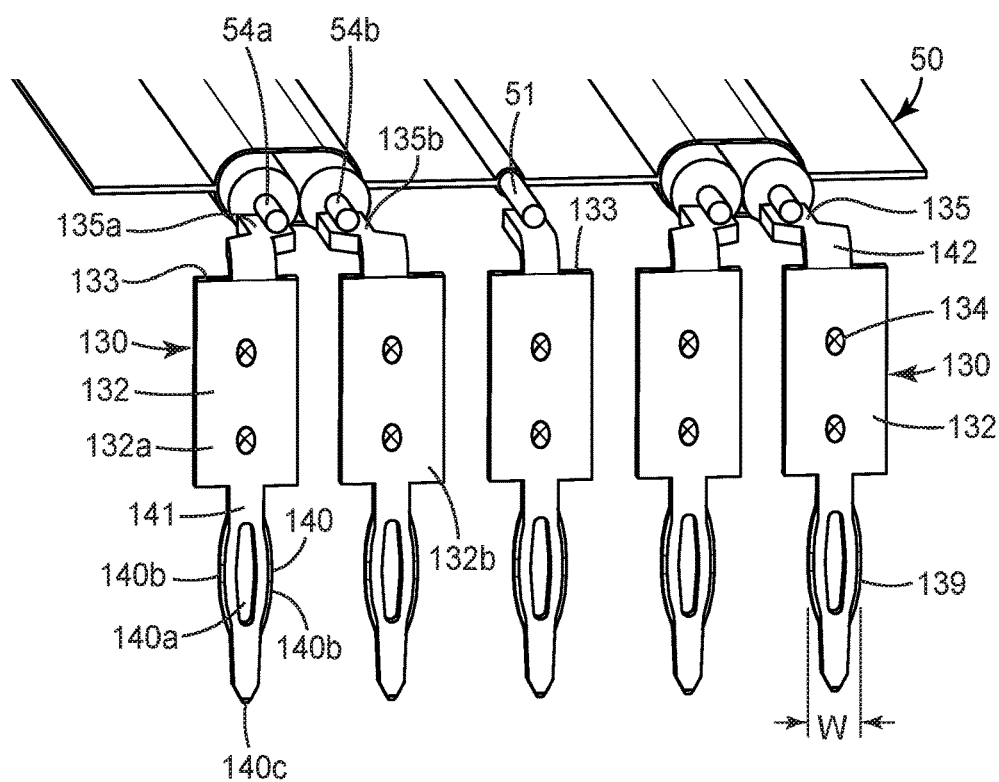
FIGS. 3A-3C are three views of a plurality of self-supporting terminals of the low profile electrical connector of FIGS. 1A-1D.

Referring to FIGS. 2A-2C and 3A, each of the self-supporting terminals 130 has a retaining portion 132 that is received in a corresponding receiving through hole 120 to retain the terminal in insulative housing 110. Retaining portion 132 includes at least one anchoring feature 134 in a face of the retaining portion. For example FIGS. 3A and 2C show two anchoring features formed in the retaining portion by a stamping or punching such that a divot is formed on one side of the retaining portion and a protrusion is formed on the other side opposite the divot. The anchoring features can interlock with corresponding features formed in a wall of the receiving through holes as shown in FIG. 2C. In some cases the retaining portion 132 is held in a corresponding receiving through hole 120 by a simple interference fit. In an alternative aspect, the retaining portion can have at least one anchoring portion extending from the edges of the retaining portion. In this aspect the at least one anchoring portion can be, for example, a barb or flange extending from the edge of the retaining portion either in an in-plane configuration or an out-of-plane configuration.

Figure 3B:
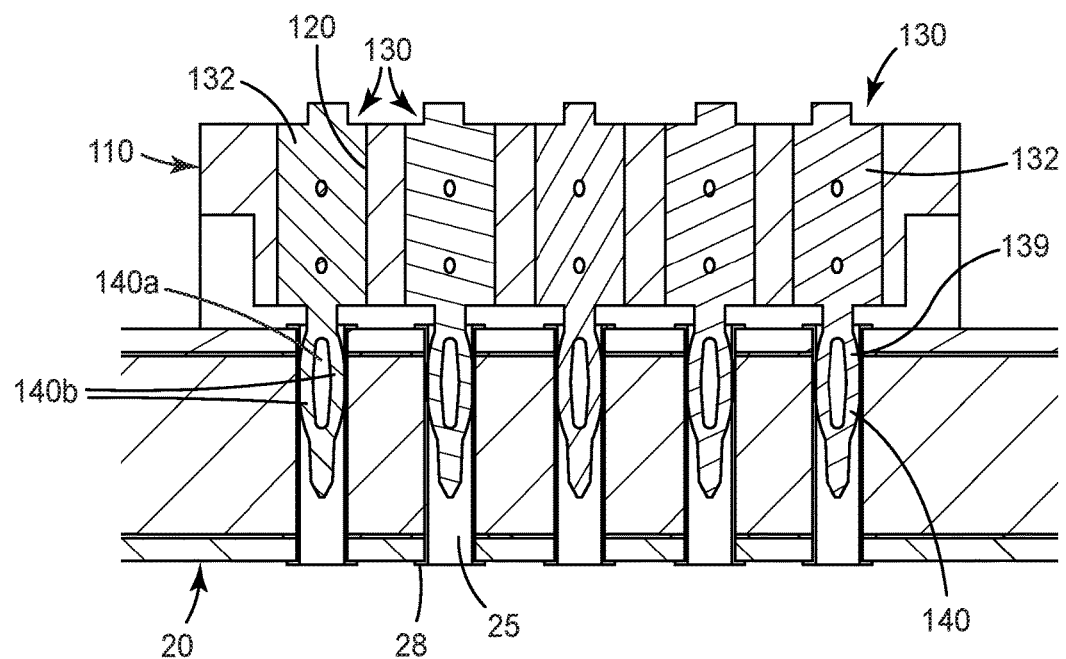
Figure 3C:
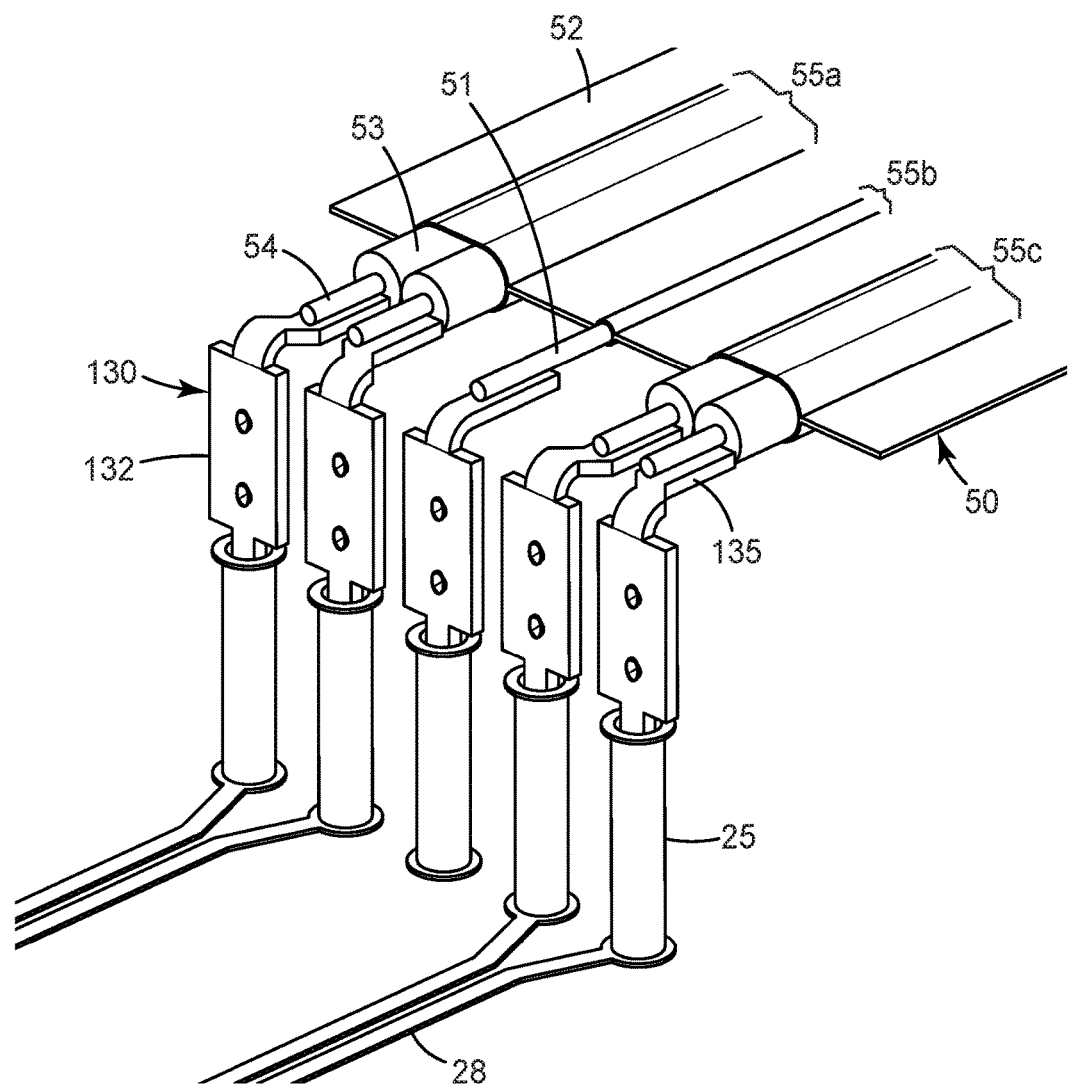

In addition, each self-supporting terminal 130 also includes a contact portion 135 extending from an upper end of, and in a direction substantially perpendicular to, the retaining portion 132 such that the contact portion is laterally offset relative to the retaining portion such that each of the self-supporting terminals is L-shaped. The contact portion is disposed on the uppermost major surface 114 of the insulative housing 110. A press-fit portion 139 extends from a lower end of, and in a direction substantially parallel to, the retaining portion. In one aspect, the retaining portion can be wider than the contact portion. The difference in widths of the retaining and contact portions defines a press portion 133 at the upper end of the retaining portion for pressing the press-fit portion of the self-supporting terminal into a conductive via 25 of a circuit board 20 (FIGS. 3B and 3C). A downward force can be exerted on the press portion to press or push the press-fit portion of the self-supporting terminal into a conductive via of a circuit board.

More specifically, press-fit portion 139 extends downwardly from the lowermost major surface 116 of the insulative housing 110 and can be inserted into conductive via formed in the circuit board. In an exemplary aspect, the press-fit portion 139 can be configured as a compliant pin. The compliant pin is characterized by a compliant section 140 having a central slot 140a between two rails 140b, and a tapered end 140c. The compliant section is attached to the retaining portion 132 by a shank section 141. The compliant section is characterized by a width, W. The width of the compliant section should be greater than the diameter of via 25 into which it will be inserted compressing the compliant section. The compliant pin can have an external plating or coating layer, such as a tin/nickel coating layer or a gold/nickel coating layer which can withstand the insertion of the compliant pin into the via and provide a reliable electrical connection of the self-supporting terminal.

Conductive wires can be connected to the contact portion of the plurality of self-supporting terminals of connector 100, for example, by a soldering process. Thus, the exemplary connector is adapted to electrically and physically engage a conductive wire of an electrical cable and connect the conductive wire with a conductive via of a circuit board by insertion of each of the press-fit portion of the self-supporting terminals into the conductive via.

Referring to FIGS. 2A and 3A, contact portions 135a, 135b of adjacent terminals can be laterally offset relative to their corresponding retaining portions 132a, 132b such that separation between the contact portions is less than a separation between the press-fit portions 140. For example, contact portion 135a bends or is offset toward contact portion 135b and contact portion 135b bends toward contact portion 135a. Reducing the distance between the contact portions enables the exemplary connector to accommodate cables having very closely spaced conductive wires, for example, Twin Axial Cables available from 3M Company (St. Paul, Minn.) and described in U.S. Pat. Nos. 8,658,899 and 8,946,558 and US Patent Publication Nos. 2012/0090866, 2012/0090873, 2014/0345902 and 2015/0053454, the disclosures of which are incorporated by reference herein in their entirety.

Each self-supporting terminal 130 can further include a curved bending portion 142 joining the upper end of the retaining portion 132 to the contact portion 135. The curved bending portion enables the contact portion to be disposed generally perpendicular to said retaining portion which reduces the overall height of connector 100 when it is mounted on a circuit board.

FIGS. 2A and 2B shows the contact portions 135 of the self-supporting terminals 130 disposed on the uppermost major surface 114 of the insulative housing 110. The uppermost major surface of the insulative housing can include a raised platform 125 proximate the plurality of receiving through holes, the contact portions of the plurality of self-supporting terminals resting on the raised platform. The raised platform comprises a first raised edge 125a closer to the plurality of receiving through holes and an opposite second raised edge 125b farther from the plurality of receiving through holes. In an exemplary aspect, the raised platform can include a plurality of grooves 121 formed in the top surface thereof. The grooves are configured to receive and hold the contact portions of a corresponding self-supporting terminal. In a first aspect, the surface of the contact portions can be flush with the surface of the raised platform. In another aspect, the surface of the contact portions can be recessed with respect to the surface of the raised platform allowing the side walls of the grooves to serve as alignment guides to ensure proper alignment of the conductive wires with the contact portions of the self-supporting terminals.

Connector 100 can further include a cover 150 (see, e.g., FIGS. 1B and 1D) removably assembled to the base of housing 110 to protect at least a portion of the plurality of self-supporting terminals 130. The cover can have an opening 152 to allow at least one of a portion of the contact portion and the upper end of the retaining portion (i.e. the press portion) of each self-supporting terminal being accessible through the opening. In one aspect, the cover can hold the conductive wires in electrical contact with the contact portions by clamping the conductive wires between the contact portion and the cover. In an alternative aspect, cover 150 can be permanently attached to the base of the housing.

In another embodiment, connector 100 above can be used in combination with a plurality of conductive wires 54 to form a connector assembly, shown in FIGS. 1A-1D. Thus, the connector of the connector assembly electrically connects a plurality of conductive wires to traces 28 on a circuit board 20 through a plurality of conductive vias 25 (FIGS. 3B and 3C).

Referring to the 1A-1C thru 3A-3C, connector 100 includes a housing 110 defining a plurality of receiving through holes 120 therein extending between opposing uppermost and lowermost major surfaces 114, 116 of the housing; and a plurality of self-supporting terminals 130. Each of the self-supporting terminals has a retaining portion 132 that is received in a corresponding receiving through hole to secure or retain the terminal in the housing, a contact portion 135 extending from an upper end of, and in a direction substantially perpendicular to, the retaining portion such that the contact portion is disposed on the uppermost major surface of the housing and a press-fit portion 139 extending from a lower end of, and in a direction substantially parallel to, the retaining portion. The press-fit portion extends downwardly below the lowermost major surface of the housing. Thus, the exemplary connector is adapted to electrically and physically engage a conductive wire of an electrical cable and connect the conductive wire with a conductive via of a circuit board by insertion of each of the press-fit portion of the self-supporting terminals into conductive via formed in the circuit board. In an exemplary aspect, each conductive wire is soldered to the contact portion of a corresponding self-supporting terminal.

Connector 100 can also have a cover 150 that is removably assembled to the housing wherein the cover includes an opening that exposes at least one of a portion of the contact portion and the upper end of the retaining portion of each self-supporting terminal. The exposed portion or press portion can be accessible from outside of the housing, such that when mating the connector to a circuit board 20, a force can be applied to the press portion such that the press-fit portion is inserted into a conductive via of the circuit board.

As mentioned previously, the surface of the contact portions 135 can be recessed with respect to the surface of the raised platform 125 allowing the side walls of the grooves to serve as alignment guides to properly align the conductive wires with the contact portions of the self-supporting terminals 130. In some embodiments, the cover can clamp the conductive wires against the contact portions to establish an electrical connection between the conductive wires and self-supporting terminals. This connection method allows the conductive wires to be connected and disconnected from the self-supporting terminals with the simple assembly or removal of the cover.

The conductive wires 54 can be part of fine pitch ribbon cable 50 as shown in FIGS. 2A and 3A. The conductive wires can be arranged in conductor sets 55, such as conductor sets 55a, 55b, 55c. Each conductor set extends along a length of the cable and includes one or more conductive wires 54. The conductive wires can include a dielectric layer 53 surrounding the conductive wire to isolate one conductive wire from an adjacent conductive wire in the same conductor set. The conductor sets can be assembled into fine pitch ribbon cable by arranging them within an external covering 52. The conductive wires can be a signal wire, a power wire or a ground or drain wire.

The conductive wires 54 and/or ground wires 51 may comprise any suitable conductive material, for example, copper, silver, aluminum, gold, and alloys thereof, and can have a variety of cross sectional shapes and sizes, such as circular, oval, rectangular or any other cross sectional shape. One or more conductors and/or ground wires in a cable may have one shape and/or size that differs from other one or more conductors and/or ground wires in the cable. The conductors and/or ground wires may be solid or stranded wires. The connectors and/or ground wires may be coated or plated with various metals and/or metallic materials, including gold, silver, tin, and/or other materials.

The dielectric materials used for the external dielectric layer or the dielectric layer surrounding the conductive wires can be any suitable material that achieves the desired electrical properties of the cable. In some cases, the insulation used may be a foamed insulation which includes air to reduce the dielectric constant and the overall thickness of the cable.

In a first aspect, the external covering can be an external dielectric layer or jacket. The fine pitch ribbon cable can be formed by extruding the external dielectric layer around the conductor sets by feeding the conductor sets through the die as the jacket material is extruded, or by laminating a at least one dielectric films on opposite first and second sides of the conductor sets. Exemplary dielectric materials include any suitable polymeric material, including but not limited to polyester, polyimide, polyamide-imide, polytetrafluoroethylene, polypropylene, polyethylene, polyphenylene sulfide, polyethylene naphthalate, polycarbonate, silicone rubber, ethylene propylene diene rubber, polyurethane. In some embodiments an adhesive can be disposed between the external covering and the conductive wires. Exemplary adhesives can be thermoplastic adhesives, pressure sensitive adhesives or flexible structural adhesives. The exemplary adhesives can be acrylic, silicone, polyolefin, epoxy or rubber based adhesives. The adhesives can adhere laminated external covering layers together and/or fill any gaps around the conductive wires.

In a second aspect, the external covering can be a shielding layer formed of first and second conductive shielding films disposed on opposite first and second sides of the conductor sets. Exemplary conductive shielding films can be metallic foils, adhesive coated metallic foils, metal coated dielectric films, or metal/dielectric composite materials formed by laminating a metal foil and a dielectric film. Materials for the shielding films layer can include any suitable conductive material, including but not limited to copper, silver, aluminum, gold, and alloys thereof. An adhesive layer can bond the first shielding film to the second shielding film.

When using shielding materials having both metallic and dielectric layers, the cable can have either an exposed metallic surface (i.e. the dielectric layer is disposed adjacent to the conductor sets) or an exposed dielectric surface (i.e. the metallic layer is disposed adjacent to the conductor sets). In the latter embodiment, an adhesive layer can bond the first shielding film to the second shielding film.

When the fine pitch ribbon cable is formed by laminating films on the opposing sides of the conductor sets, the cable can have pinched portions between each connector set and along the external edges of the cable. The pinched portions are formed when a patterned tool is used during the lamination process. In shielded electrical cable embodiments, an adhesive layer is used to bond the first shielding film and second shielding films together, the adhesive bonds the shielding layers together in the pinched portions. Thus, the first and second shielding films include cover portions and pinched portions arranged such that, in cross-section, the cover portions of the first and second shielding films in combination substantially surround each conductor set. The conductor sets can include conductive wires 54 including insulated wires to transmit electrical signals or power, and non-insulated ground or drain wires 51. Some of the conductor sets extend along a length of the cable and have one or more insulated conductors; each insulated conductor comprises a central conductor surrounded by a dielectric material. In some shielded electrical cable embodiments, at least one of the conductor sets can be a non-insulated ground or a drain wire.

In particular the low profile connector 100 (without its cover) of FIG. 2A is configured to interconnect with four signal/power wires 54 and one ground/drain wire 51. These wires can be in the four of independent cables, the each pair of signal/power wires is combined into a micro coaxial cable or the wires can be part of a fine pitch ribbon cable, such as cable 50, 50' in the FIGS. 2A and 5. Cables 50, 50' each include three conductor sets 55a, 55b, 55c and 55a', 55b', 55c', respectively, (collectively conductor sets 55, 55'). Conductor sets 55a, 55c and 55a', 55c' contain a pair of signal/power wires 54, 54' while conductor set 55b, 55b' includes a ground/drain wires 51, 51'.

Figure 5:
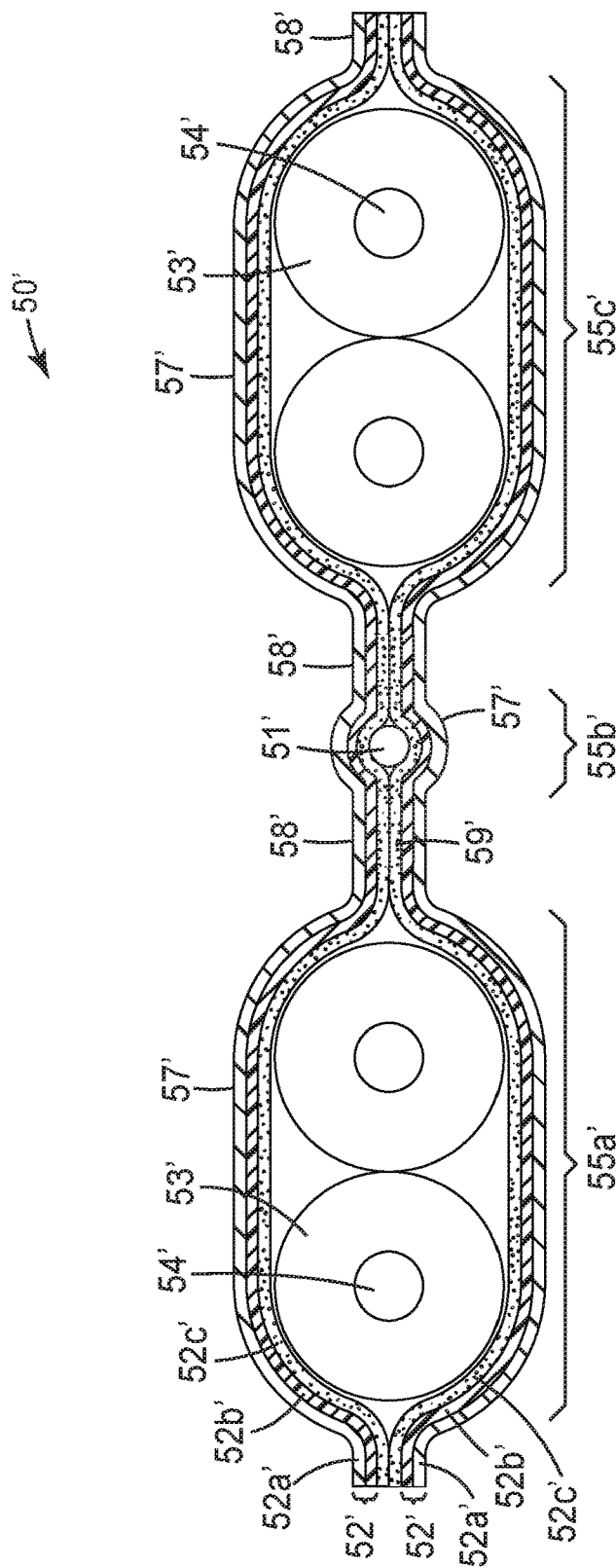
FIG. 5 is a cross sectional view of an alternative cable that can be terminated with the low profile electrical connector of the present invention

Referring to FIG. 5, shielded electrical cable 50' has three conductor sets 55a'-55c' disposed within an external covering 52'. External covering 52' is formed from a first and a second tri-layer shielding film. The tri-layer shielding film has a dielectric layer 52a', a metallic layer 52b' adjacent to the dielectric layer and an adhesive layer 52c' disposed on the metallic layer. First and second conductive shielding films are disposed on opposite first and second sides of the conductor sets, respectively. Conductor sets 55a' and 55c' each include two insulated conductors (i.e. conductive wires 54' encased in dielectric layer 53') and conductor set 55b' includes a ground or drain wire 51'. Cable 50' includes cover portions 57' and pinched portions 58' arranged such that, in cross-section, the cover portions of the first and second shielding films in combination substantially surround each conductor set and the at least one drain wire, and the first and second shielding films in combination form pinched portions in between adjacent conductor sets and along the edges of the cable. The adhesive layer bonds the first shielding film to the second shielding film in the pinched portions of the cable. Each conductive wire of the insulated conductors and the at least one drain wire of the cable can be physically and electrically attached to the contact portion of a corresponding self-supporting terminal as described previously with respect to FIGS. 2A and 3A. In exemplary aspect, the plurality of conductive wires includes at least one ground wire, at least one signal wire, and at least one power wire.

Figure 6A:
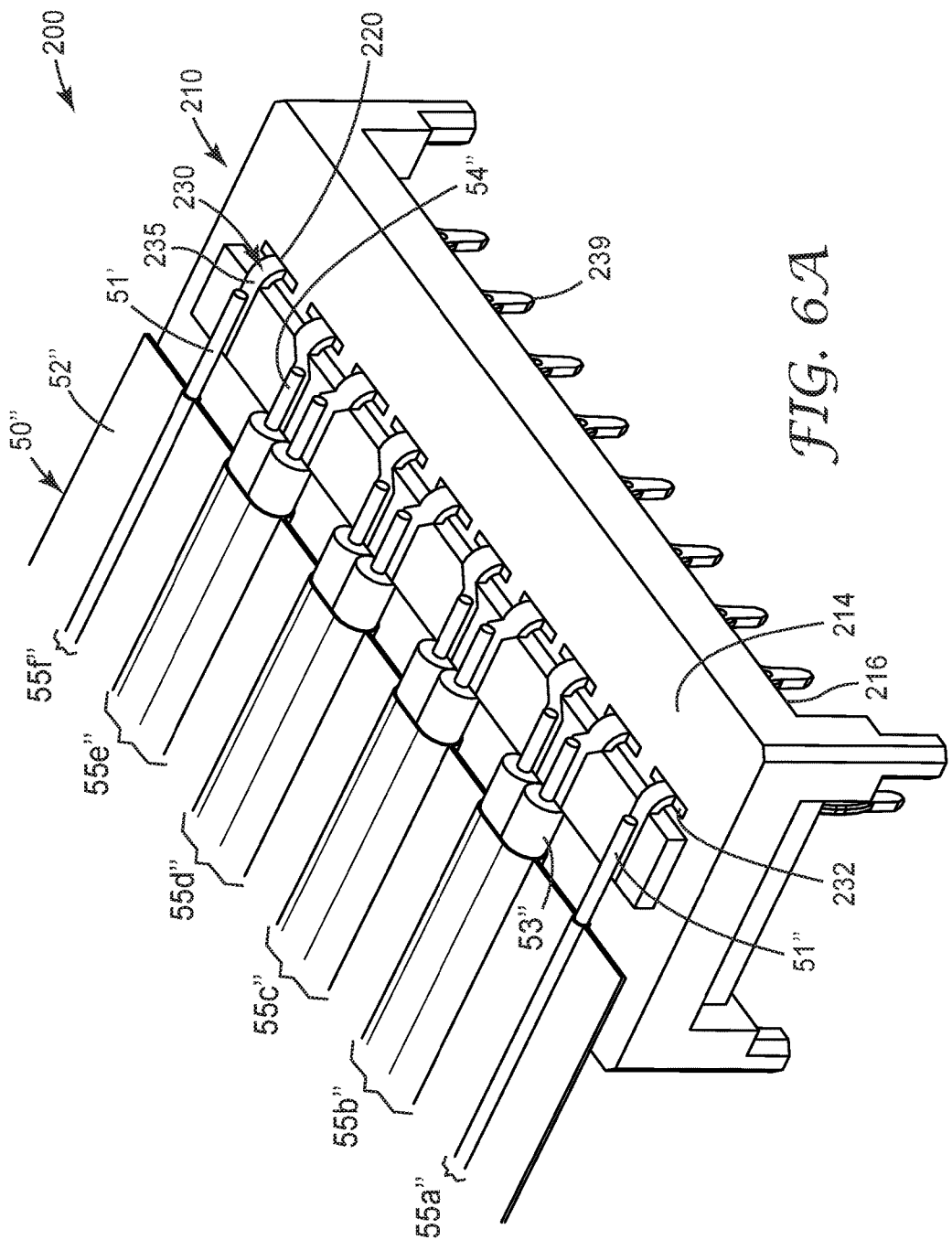
FIGS. 6A and 6B are two views showing another alternative low profile electrical connector and an exemplary cable that can be terminated with said connector according to the present invention.
Figure 6B:
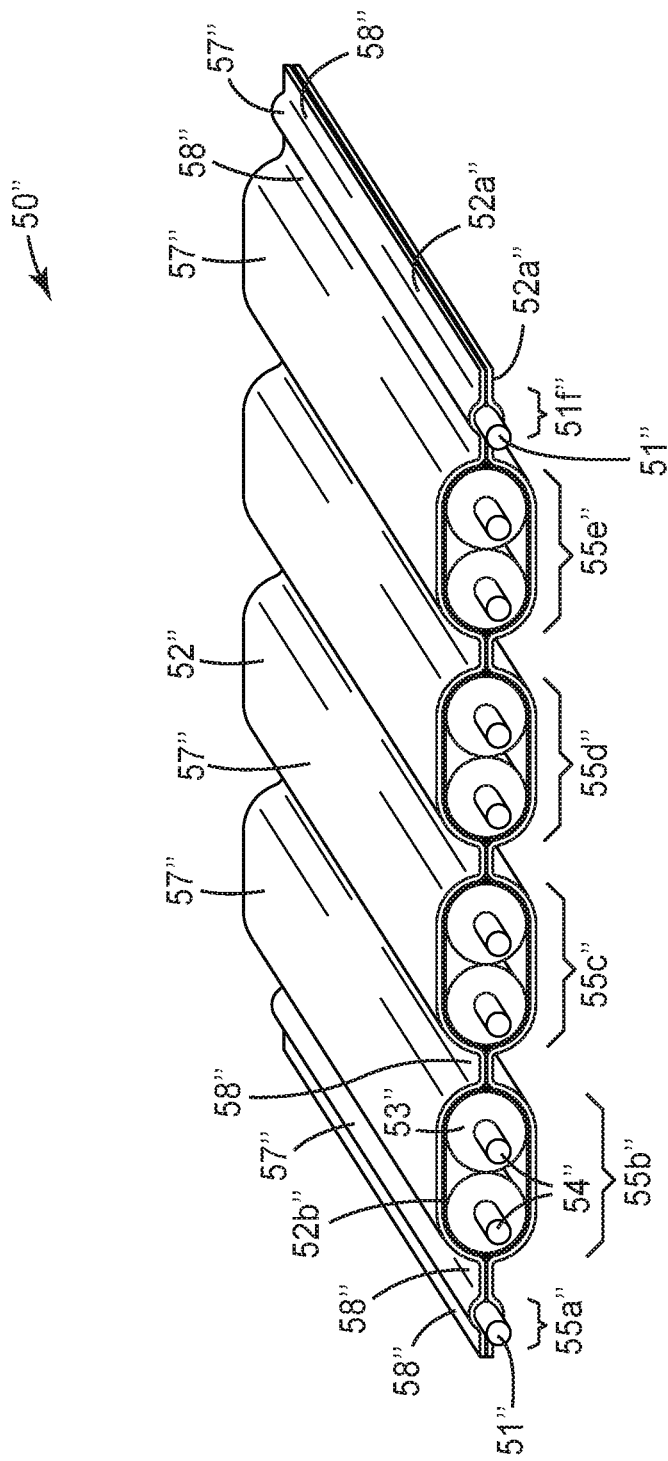

FIGS. 6A and 6B show a variation of an exemplary connector of the current invention for use with a different shielded electrical cable 50". Connector 200 has an insulative housing 210 defining a plurality of receiving through holes 220 extending between opposing uppermost and lowermost major surfaces 214, 216, respectively, of the housing and a plurality of self-supporting terminals 230 held within the plurality of receiving through holes. Each of the self-supporting terminals has a retaining portion (not shown) that is received in a corresponding receiving through hole to retain the terminal in the housing, a contact portion 235 extending from an upper end of, and in a direction substantially perpendicular to, the retaining portion such that the contact portion is disposed on the uppermost major surface of the housing and a press-fit portion 239 extending from a lower end of, and in a direction substantially parallel to, the retaining portion, the press-fit portion extending downwardly from the lowermost major surface of the housing, as described previously.

Connector 200 is configured to terminate a fine pitch ribbon cable, such as shielded electrical cable 50". Referring to FIGS. 6A and 6B, shielded electrical cable 50" has six conductor sets 55a"-55f" disposed within an external covering 52". Each conductor set extends along a length of the cable and includes one or more conductive wires 54". The shielded electrical cable includes a plurality of differential pairs arranged generally in a plane along a width of the cable and extending along a length of the cable. Each differential pair including two or more insulated conductors (i.e. conductive wires 54" surrounded by dielectric layer 53") and being substantially surrounded by a metallic shield layer 52b". In addition to the differential pairs, cable 50" includes two conductor sets 55a", 55f" containing ground or drain wires 51".

External covering 52" comprises first and second non-conductive polymeric or dielectric layers 52a" disposed on opposite sides of the conductor sets. The first and second layers including cover portions 57" disposed over the conductor sets and pinched portions 58" disposed between the conductor sets (i.e. on each side of the differential pairs) and along the longitudinal edges of the cable. The cover portions and pinched portions are arranged such that they substantially surround the plurality of differential pairs when looking at the transverse cross section of cable 50". When the first and second dielectric layers are thermoplastic polymer films, they can be bonded to one another through the application of pressure and heat at the pinched portions. Alternatively, an adhesive layer (not shown in FIGS. 6A and 6B, but represented in FIG. 5 as adhesive layer 52c') can be used to bond the first dielectric layer to the second dielectric layer in the pinched portions of the cable.

Each of the insulated conductors (conductive wires 54" surrounded by dielectric layer 53") of the cable 50" as well as the ground wires 51" can be physically and electrically attached to the contact portion 235 of a corresponding self-supporting terminal 230 of connector 200.

Referring back to FIGS. 1A and 1B, connector 100 has an insulative housing 110 having a base 112 and a cover 150. A plurality of receiving through holes 120 are formed through a portion of the housing and are configured to hold a plurality of self-supporting terminals 130. Each self-supporting terminal has a retaining portion 132 (see FIG. 3A) received in a corresponding receiving through hole to retain the self-supporting terminal in the housing, a contact portion 135 extending from an upper end of the retaining portion, a press-fit portion 139 extending from a lower end of the retaining portion and a press portion 133 at the upper end of the retaining portion.

The contact portion is characterized by a first width and the retaining portion is characterized by a second width that is greater than the first width of the contact portion. The difference in widths of the retaining and contact portions define the press portion at the upper end of the retaining portion of each self-supporting terminal. The press portion is exposed and accessible from outside of the housing, such that when mating the connector with a circuit board 20, the press portion can be pressed external of the housing. Applying a force to the press portion caused the press-fit portion to be pushed or inserted into a conductive via of the circuit board. The contact portion of each self-supporting terminal is disposed within the housing and is adapted to electrically and physically engage a conductive wire 54 of an electrical cable 50. Thus, the exemplary connector is adapted to electrically and physically engage a conductive wire of an electrical cable and connect the conductive wire with a conductive via of a circuit board by insertion of each of the press-fit portion of the self-supporting terminals into conductive via formed in the circuit board.

The exemplary connectors 100, 200, described herein, can be used to electrically connect a plurality of wires to a plurality of conductive vias formed in a circuit board. The connector has an insulative housing 110, 210 is provided that has a plurality of receiving through holes 120, 220 therein extending between opposing uppermost and lowermost major surfaces of the housing, A self-supporting terminal 130, 230 is inserted into each receiving through hole from the uppermost major surface of the insulative housing, wherein the self-supporting terminal comprises a contact portion 135, 235 disposed on the uppermost major surface of the insulative housing, a retaining portion 132, 232 received in the receiving through hole for retaining the terminal in the insulative housing, and a press-fit portion 139, 239 extending downwardly from the lowermost major surface of the insulative housing. An exposed conductive end of a conductive wire 54 is electrically and physically connected to the contact portion of each self-supporting terminal and a cover 150 is assembled onto the uppermost major surface of the insulative housing. The cover has an opening therein such that a portion of each self-supporting terminal is exposed and accessible through the opening.

The insulative housing 110, 210 is placed on the circuit board 20 so that the press-fit portion 139, 239 of each self-supporting terminal 130, 230 is aligned with a corresponding conductive via 25 (FIG. 1D). Each exposed portion of at least one self-supporting terminal is accessed through the opening and pressed until the press-fit portion of the at least one self-supporting terminal is inserted into the corresponding conductive via.

A plurality of wires can be connected to a plurality of conductive vias in a circuit board utilizing an exemplary connector described above. The connector comprises an insulative that has a plurality of receiving through holes therein extending between opposing uppermost and lowermost major surfaces of the housing. A self-supporting terminal is inserted into each receiving through hole from the uppermost major surface of the insulative housing, wherein the self-supporting terminal comprises a contact portion disposed on the uppermost major surface of the insulative housing, a retaining portion received in the receiving through hole for retaining the terminal in the insulative housing, and a press-fit portion extending downwardly from the lowermost major surface of the insulative housing. An exposed conductive end of a conductive wire is electrically and physically connected to the contact portion of each self-supporting terminal, and a cover is assembled onto the uppermost major surface of the insulative housing. The cover has an opening therein such that a portion of each self-supporting terminal is exposed and accessible through the opening. The insulative housing is placed on the circuit board so that the press-fit portion of each self-supporting terminal is aligned with a corresponding conductive via. Each exposed portion of at least one self-supporting terminal is accessed through the opening and pressed until the press-fit portion of the at least one self-supporting terminal is inserted into the corresponding conductive via.

In general, impedance mismatch can be a cause of decreasing signal integrity performance in high speed electrical connectors. The exemplary connectors of the present invention seek to control impedance by controlling dimensions and material constants (e.g. dielectric constant of insulator) of contact and housing. The exemplary connector can also control the distance between signal and ground conductors where they connect at the terminals to improve the impedance performance of the connector. The form factor of the exemplary connector is minimized by disposing the contact portion of the self-supporting terminals generally perpendicular to the retaining portions of said terminals. This minimizing of the form factor of the exemplary connector allows for shorter electrical path lengths which in turn can reduce impedance mismatch providing improved signal integrity.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A connector for electrically connecting an electrical cable to a circuit board, comprising:
   an insulative housing defining a plurality of receiving through holes therein extending between opposing uppermost and lowermost major surfaces of the housing; and
   a plurality of self-supporting terminals, each self-supporting terminal comprising:
   a retaining portion received in a corresponding receiving through hole and retaining the terminal in the housing;
   a contact portion extending from an upper end of, and in a direction substantially perpendicular to, the retaining portion, the contact portion disposed on the uppermost major surface of the housing and adapted to electrically and physically engage a conductive wire of an electrical cable; and
   a press-fit portion extending from a lower end of, and in a direction substantially parallel to, the retaining portion, the press-fit portion extending downwardly from the lowermost major surface and adapted to be inserted into a conductive via of a circuit board, wherein the plurality of the receiving through holes are arranged in one or more rows.

2. The connector of claim 1 further comprising a plurality of alignment legs extending downwardly from the lowermost major surface for mounting the connector to a circuit board.

3. The connector of claim 1, wherein the plurality of the receiving through holes are arranged in one or more rows.

4. The connector of claim 1, wherein each self-supporting terminal further comprises a curved bending portion joining the upper end of the retaining portion to the contact portion.

5. The connector of claim 1, wherein each self-supporting terminal comprises a press portion at the upper end of the retaining portion for pressing the press-fit portion of the self-supporting terminal into the conductive via of the circuit board.

6. The connector of claim 1, wherein the retaining portion is wider than the contact portion.

7. The connector of claim 1, wherein the contact portion is characterized by a first width and the retaining portion is characterized by a second width such that there is a difference between the first width and the second width.

8. The connector of claim 1, wherein at least for one self-supporting terminal, the contact portion is laterally offset relative to the retaining portion.

9. The connector of claim 1, wherein at least for a pair of adjacent self-supporting terminals, a separation between the contact portions is less than a separation between the press-fit portions.

10. The connector of claim 7, wherein the difference in widths of the retaining and contact portions defining a press portion at the upper end of the retaining portion of each self-supporting terminal for pressing the press-fit portion of the self-supporting terminal into the conductive via of the circuit board.

11. A connector for electrically connecting an electrical cable to a circuit board, comprising:
    an insulative housing defining a plurality of receiving through holes therein extending between opposing uppermost and lowermost major surfaces of the housing; and
    a plurality of self-supporting terminals, each self-supporting terminal comprising:
    a retaining portion received in a corresponding receiving through hole and retaining the terminal in the housing;
    a contact portion extending from an upper end of, and in a direction substantially perpendicular to, the retaining portion, the contact portion disposed on the uppermost major surface of the housing and adapted to electrically and physically engage a conductive wire of an electrical cable; and
    a press-fit portion extending from a lower end of, and in a direction substantially parallel to, the retaining portion, the press-fit portion extending downwardly from the lowermost major surface and adapted to be inserted into a conductive via of a circuit board, wherein the uppermost major surface of the insulative housing comprises a raised platform proximate the plurality of receiving through holes, the contact portions of the plurality of self-supporting terminals resting on the raised platform.

12. The connector of claim 11, wherein the raised platform comprises a first raised edge closer to the plurality of receiving through holes and an opposite second raised edge farther from the plurality of receiving through holes.

13. The connector of claim 11, wherein the raised platform comprises a plurality of grooves formed therein, each groove receiving the contact portion of a corresponding self-supporting terminal.

14. A connector for electrically connecting an electrical cable to a circuit board, comprising:
an insulative housing defining a plurality of receiving through holes therein extending between opposing uppermost and lowermost major surfaces of the housing;
a plurality of self-supporting terminals, each self-supporting terminal comprising:
a retaining portion received in a corresponding receiving through hole and retaining the terminal in the housing;
a contact portion extending from an upper end of, and in a direction substantially perpendicular to, the retaining portion, the contact portion disposed on the uppermost major surface of the housing and adapted to electrically and physically engage a conductive wire of an electrical cable;
a press-fit portion extending from a lower end of, and in a direction substantially parallel to, the retaining portion, the press-fit portion extending downwardly from the lowermost major surface and adapted to be inserted into a conductive via of a circuit board; and
a cover removably assembled to the insulative housing for at least protecting the contact portions of the plurality of self-supporting terminals, the cover defining an opening therein to expose a portion of the self-supporting terminals.

15. The connector of claim 14, wherein at least one of a portion of the contact portion and the upper end of the retaining portion of each self-supporting terminal is exposed and is accessible through the opening.

16. A connector assembly, comprising a connector electrically connecting a plurality of conductive wires to a circuit board comprising a plurality of conductive vias, the connector comprising:
a housing defining a plurality of receiving through holes therein extending between opposing uppermost and lowermost major surfaces of the housing; and
a plurality of self-supporting terminals, each self-supporting terminal comprising:
a retaining portion received in a corresponding receiving through hole for retaining the terminal in the housing;
a contact portion extending from an upper end of, and in a direction substantially perpendicular to, the retaining portion, the contact portion disposed on the uppermost major surface of the housing and electrically and physically attached to a corresponding conductive wire in the plurality of conductive wires; and
a press-fit portion extending from a lower end of, and in a direction substantially parallel to, the retaining portion, the press-fit portion extending downwardly from the lowermost major surface and inserted into and making electrical contact with a corresponding conductive via of the circuit board, wherein the plurality of conductive wires comprises at least one ground wire, at least one signal wire, and at least one power wire.

17. The connector assembly of claim 16, wherein each conductive wire is soldered to the contact portion of a corresponding self-supporting terminal.

18. A connector assembly, comprising a connector electrically connecting a plurality of conductive wires to a circuit board comprising a plurality of conductive vias, the connector comprising:
a housing defining a plurality of receiving through holes therein extending between opposing uppermost and lowermost major surfaces of the housing;
a plurality of self-supporting terminals, each self-supporting terminal comprising:
a retaining portion received in a corresponding receiving through hole for retaining the terminal in the housing;
a contact portion extending from an upper end of, and in a direction substantially perpendicular to, the retaining portion, the contact portion disposed on the uppermost major surface of the housing and electrically and physically attached to a corresponding conductive wire in the plurality of conductive wires; and
a press-fit portion extending from a lower end of, and in a direction substantially parallel to, the retaining portion, the press-fit portion extending downwardly from the lowermost major surface and inserted into and making electrical contact with a corresponding conductive via of the circuit board; and
a cover removably assembled to the insulative housing for at least protecting the contact portions of the plurality of self-supporting terminals.

19. The connector assembly of claim 18, wherein the cover can hold the conductive wires in electrical contact with the contact portions by clamping the conductive wires between the contact portion and the cover.

20. The connector assembly of claim 18, wherein the cover has an opening formed therein such that at least one of a portion of the contact portion and the upper end of the retaining portion of each self-supporting terminal being accessible through the opening.

21. A connector assembly, comprising a connector electrically connecting a plurality of conductive wires to a circuit board comprising a plurality of conductive vias, the connector comprising:
a housing defining a plurality of receiving through holes therein extending between opposing uppermost and lowermost major surfaces of the housing; and
a plurality of self-supporting terminals, each self-supporting terminal comprising:
a retaining portion received in a corresponding receiving through hole for retaining the terminal in the housing;
a contact portion extending from an upper end of, and in a direction substantially perpendicular to, the retaining portion, the contact portion disposed on the uppermost major surface of the housing and electrically and physically attached to a corresponding conductive wire in the plurality of conductive wires; and
a press-fit portion extending from a lower end of, and in a direction substantially parallel to, the retaining portion, the press-fit portion extending downwardly from the lowermost major surface and inserted into and making electrical contact with a corresponding conductive via of the circuit board, wherein the plurality of the conductive wires are part of a shielded electrical cable, the cable comprising one or more conductor sets and at least one drain wire, each conductor set extending along a length of the cable and comprising one or more insulated conductors, each insulated conductor comprising a central conductor surrounded by a dielectric material;

first and second conductive shielding films disposed on opposite first and second sides of the conductor sets and the at least one drain wire, the first and second conductive shielding films including cover portions and pinched portions arranged such that, in cross-section, the cover portions of the first and second shielding films in combination substantially surround each conductor set and the at least one drain wire, and the pinched portions of the first and second shielding films in combination form pinched portions of the cable on each side of the conductor set and each side of the at least one drain wire; and an adhesive layer bonding the first shielding film to the second shielding film in the pinched portions of the cable, wherein each of the insulated conductors and the at least one drain wire of the cable is physically and electrically attached to the contact portion of a corresponding self-supporting terminal.

22. A connector assembly, comprising a connector electrically connecting a plurality of conductive wires to a circuit board comprising a plurality of conductive vias, the connector comprising:

a housing defining a plurality of receiving through holes therein extending between opposing uppermost and lowermost major surfaces of the housing;

a plurality of self-supporting terminals, each self-supporting terminal comprising:

a retaining portion received in a corresponding receiving through hole for retaining the terminal in the housing;

a contact portion extending from an upper end of, and in a direction substantially perpendicular to, the retaining portion, the contact portion disposed on the uppermost major surface of the housing and electrically and physically attached to a corresponding conductive wire in the plurality of conductive wires; and a press-fit portion extending from a lower end of, and in a direction substantially parallel to, the retaining portion, the press-fit portion extending downwardly from the lowermost major surface and inserted into and making electrical contact with a corresponding conductive via of the circuit board, wherein the plurality of the conductive wires are part of a shielded electrical cable, the cable comprising:

a plurality of differential pairs extending along a length of the cable and being arranged generally in a plane along a width of the cable, each differential pair including two or more insulated conductors, each differential pair being substantially surrounded by a shield;

first and second non-conductive polymeric layers disposed on opposite sides of the cable, the first and second layers including cover portions and pinched portions arranged such that, in transverse cross section, the cover portions of the first and second layers in combination substantially surround the plurality of differential pairs, and the pinched portions of the first and second layers in combination form pinched portions of the cable on each side of the plurality of differential pairs; and an adhesive layer bonding the first non-conductive polymeric layer to the second non-conductive polymeric layer in the pinched portions of the cable, wherein each of the insulated conductors of the cable is physically and electrically attached to the contact portion of a corresponding self-supporting terminal.

23. A connector for electrically connecting an electrical cable to a circuit board, comprising:

an insulative housing defining a plurality of receiving through holes therein; and a plurality of self-supporting terminals, each self-supporting terminal comprising:

a retaining portion received in a corresponding receiving through hole and retaining the terminal in the housing;

a contact portion extending from an upper end of the retaining portion, the contact portion disposed within the housing and adapted to electrically and physically engage a conductive wire of an electrical cable;

a press-fit portion extending from a lower end of the retaining portion, the press-fit portion extending from the bottom surface and adapted to be inserted into a conductive via of a circuit board; and a press portion at the upper end of the retaining portion and exposed outside of the housing, such that when mating the connector with a circuit board, the press portion is pressed externally so that the press-fit portion is inserted into a conductive via of the circuit board, wherein an uppermost major surface of the insulative housing comprises a raised platform proximate the plurality of receiving through holes, the contact portions of the plurality of self-supporting terminals resting on the raised platform.

24. The connector of claim 23, wherein a difference in width of the retaining and contact portions defines the press portion at the upper end of the retaining portion of each self-supporting terminal.

25. A method of electrically connecting a plurality of wires to a plurality of conductive vias in a circuit board, the method comprising:

providing a circuit board comprising a plurality of conductive vias formed therein;

providing an insulative housing defining a plurality of receiving through holes therein extending between opposing uppermost and lowermost major surfaces of the housing, the plurality of the receiving through holes staggered in at least two rows;

inserting a self-supporting terminal into each receiving through hole from the uppermost major surface of the insulative housing, the self-supporting terminal comprising a contact portion disposed on the uppermost major surface of the insulative housing, a retaining portion received in the receiving through hole for retaining the terminal in the insulative housing, and a press-fit portion extending downwardly from the lowermost major surface of the insulative housing;

electrically and physically connecting an exposed conductive end of a conductive wire to the contact portion of each self-supporting terminal;

assembling a cover to the uppermost major surface of the insulative housing, the cover defining an opening therein, a portion of each self-supporting terminal being exposed and accessible through the opening;

placing the insulative housing on the circuit board so that the press-fit portion of each self-supporting terminal is aligned with a corresponding conductive via; and accessing the portion of at least one self-supporting terminal that is exposed through the opening and pressing the exposed portion until the press-fit portion of the at least one self-supporting terminal is inserted into the corresponding conductive via.

* * * * *